United States Patent
Khalin et al.

(10) Patent No.: US 7,030,602 B2
(45) Date of Patent: Apr. 18, 2006

(54) TESTING OF CURRENT TRANSFORMERS

(75) Inventors: Vladimir M. Khalin, Lexington, KY (US); Nicholas S. Powers, Lexington, KY (US)

(73) Assignee: Kuhlman Electric Corporation, Versailles, KY (US)

( * ) Notice: Subject to any disclaimer, the term of this patent is extended or adjusted under 35 U.S.C. 154(b) by 0 days.

(21) Appl. No.: 10/877,098

(22) Filed: Jun. 25, 2004

(65) Prior Publication Data

US 2005/0212506 A1 Sep. 29, 2005

Related U.S. Application Data

(60) Provisional application No. 60/541,796, filed on Feb. 4, 2004.

(51) Int. Cl.
*G01R 15/18* (2006.01)
*G01R 31/06* (2006.01)

(52) U.S. Cl. ........................ 324/127; 324/547
(58) Field of Classification Search ............ 324/127, 324/547

See application file for complete search history.

(56) References Cited

U.S. PATENT DOCUMENTS

| 4,654,806 | A | * | 3/1987 | Poyser et al. ............ 700/292 |
| 4,739,248 | A | * | 4/1988 | Perkins .................. 324/726 |
| 4,758,774 | A | * | 7/1988 | Crawford et al. ......... 324/726 |
| 4,857,856 | A | * | 8/1989 | Coleman et al. ......... 324/547 |
| 6,680,616 | B1 | * | 1/2004 | Khalin et al. ........... 324/547 |
| 2004/0130329 | A1 | * | 7/2004 | Suss et al. .............. 324/547 |

* cited by examiner

*Primary Examiner*—Vinh Nguyen
*Assistant Examiner*—Emily Y Chan
(74) *Attorney, Agent, or Firm*—Harness, Dickey & Pierce, P.L.C.

(57) ABSTRACT

A method for evaluating the accuracy of a current transformer is presented. The current transformer has a primary winding and a secondary winding. A current is not circulated through the primary winding. A load is disconnected from the current transformer. A load impedance is measured of an internal instrumentation associated with the current transformer. The resistance in the secondary winding of the current transformer is determined. The load impedance is compared to a standard burden. A standard burden value is selected. The secondary voltage for a rated current is determined. The injection voltage is adjusted to the value of the secondary voltage. The exciting current and power are measured. The ratio error or the phase angle are then calculated by using the exciting current and power.

8 Claims, 13 Drawing Sheets

TESTING OF CURRENT TRANSFORMERS

CROSS-REFERENCE TO RELATED APPLICATIONS

This application claims the benefit of U.S. Provisional Application No. 60/541,796, filed on Feb. 4, 2004. The disclosure of the provisional application is incorporated herein by reference.

FIELD OF THE INVENTION

The present invention relates to current transformers, and more particularly to a technique for determining the accuracy of a current transformer without removing it from its position relative to an electrical apparatus.

BACKGROUND OF THE INVENTION

A current transformer monitors a current that passes through an electrical apparatus such as a power transformer, a generator, or a circuit breaker. To ensure that a current transformer is accurately monitoring the current, the metering or the relaying accuracy of the current transformer is verified. The metering accuracy determines the ratio error and the phase angle of the current transformer through a stringent certification process established by the Institute of Electrical and Electronics Engineers (IEEE) under IEEE C57.13 (1993). In comparison, the relaying accuracy relates to measuring the secondary excitation and resistance associated with the current transformer. Generally, current transformers intended for relaying applications do not undergo the certification process under IEEE C57.13 unless the current transformer is retrofitted for a metering application.

Before an accuracy test can be performed under IEEE C57.13 (1993), the current transformer is disconnected and removed from its position within the electrical apparatus. In a traditional accuracy test, a current, referred to as a primary current, circulates through the primary winding of the current transformer and a known standard transformer of the same current ratio. The ratio and phase displacement errors of the current transformer are then determined by comparison to the known standard. This process consumes a substantial amount of time and incurs a significant cost due to removing the current transformer from its installation on or within the electrical apparatus. Frequently, it is more cost-effective to replace rather than test the existing current transformer. It is therefore desirable to have a test method that overcomes the disadvantages associated with conventional methods for determining the accuracy of a current transformer.

BRIEF DESCRIPTION OF THE DRAWINGS

FIG. 1L is a block diagram of a test system connected to internal instrumentation of a current transformer in accordance with one embodiment of the invention;

DETAILED DESCRIPTION OF THE PREFERRED EMBODIMENTS

The invention involves a method for evaluating the metering accuracy of a current transformer that is installed in or on an electrical apparatus. In particular, the metering accuracy requires that the ratio error (RE) and/or the phase angle (PA) of the current transformer be calculated.

Generally, one method requires that the primary winding of the current transformer be disconnected from the electrical apparatus. This prevents a current from circulating through the primary winding. A load impedance, $Z_B$, is then measured on an internal instrumentation of the current transformer. This load impedance is then compared to a higher standard IEEE burden value. The higher standard burden value is selected as the value of $Z_B$ to certify the current transformer. A variety of variables are then determined. A secondary voltage, representing a current transformer operating condition, is also determined. This voltage value is injected into the secondary winding of the current transformer. Thereafter, the ratio error and/or the phase angle are determined.

By implementing techniques of the claimed invention, a current transformer is evaluated for accurately measuring an operating condition without removing the current transformer from its position on an electrical apparatus. Specifically, this test allows a current transformer to remain in place inside or on top of a power transformer, mounted onto a generator, housed inside a circuit breaker, or connected to other suitable electrical apparatuses. This avoids the expense and extended downtime typically associated with removing a current transformer during a traditional metering certification process.

Examples of current transformers that may be evaluated by implementing techniques of the invention include generator current transformers (GCTs), internal bushing current transformers (BCTs), external slipover current transformers or any other suitable free standing current transformers that do not utilize turns compensation. GCTs are typically used for protecting power generators and monitoring power generation output currents, whereas BCTs are used for the monitoring and protection of substation transformers.

Figure 1A:
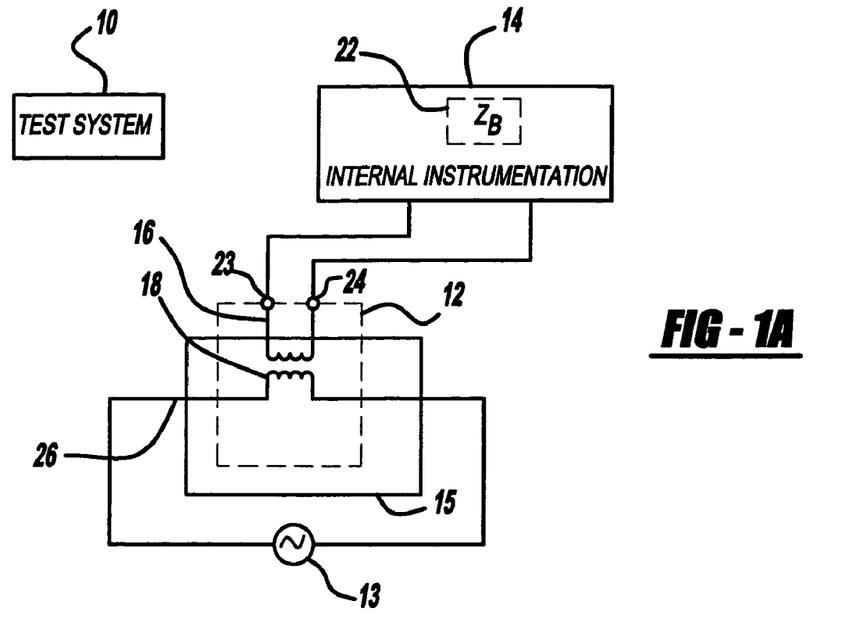
FIG. 1A illustrates a block diagram of a test system coupled to a current transformer in accordance with the present invention.

Referring to FIG. 1A, a current transformer (CT) 12 is coupled to an internal instrumentation 14 of the CT 12 and to an electrical apparatus 15 connected onto a power system 13. The internal instrumentation 14 exhibits a load impedance ($Z_B$) 22. The load impedance $Z_B$ 22, discussed in greater detail below, is a phasor that is analogous to the total resistance and reactance associated with the internal instrumentation 14. The total impedance for the internal instrumentation 14 is based upon the resistance of resistors and wires, and the reactance of capacitors and inductors associated with internal instrumentation 14.

The internal instrumentation 14 is directly coupled to the terminals 23, 24 of the CT 12. The primary winding 18 is coupled to the primary conductor 26 from the electrical apparatus 15. The primary conductor 26 of electrical apparatus 15 may be, for example, a bushing located at the top end of a power transformer. The primary conductor 26 passes through a window of the CT 12.

Figure 1B:
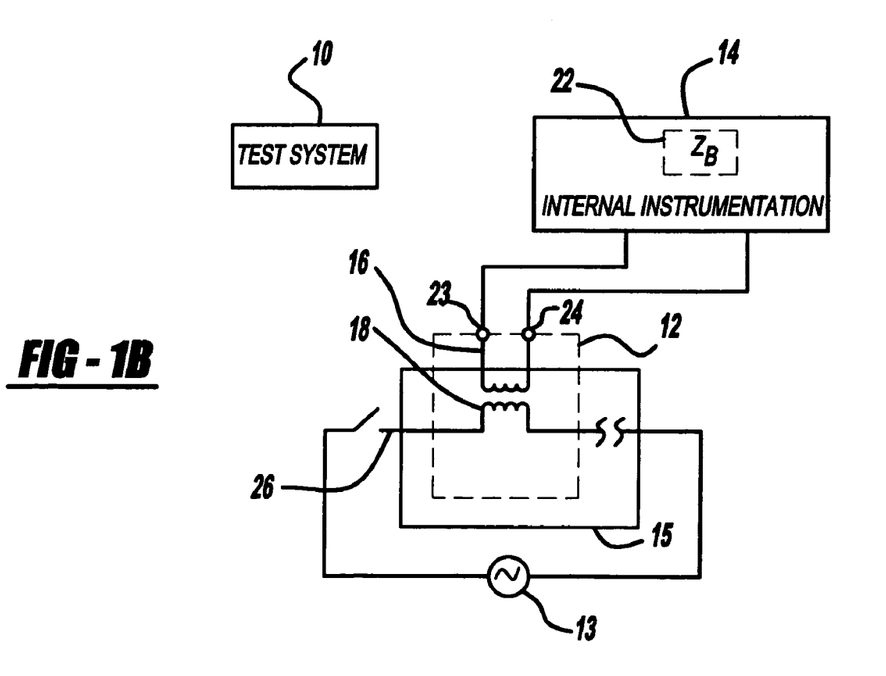
FIG. 1B illustrates a block diagram of a primary conductor disconnected from the current transformer in accordance with one embodiment of the invention.

Referring to FIG. 1B, the primary conductor 26 must be in an open state to ensure that an induced primary current is not present in the primary winding 18 while the secondary winding 16 has voltage injected. Skilled artisans understand that the primary loop introduces errors into the measurement process because an induced primary voltage modifies the measured elements on the secondary side 16 of the CT 12.

Figure 2:
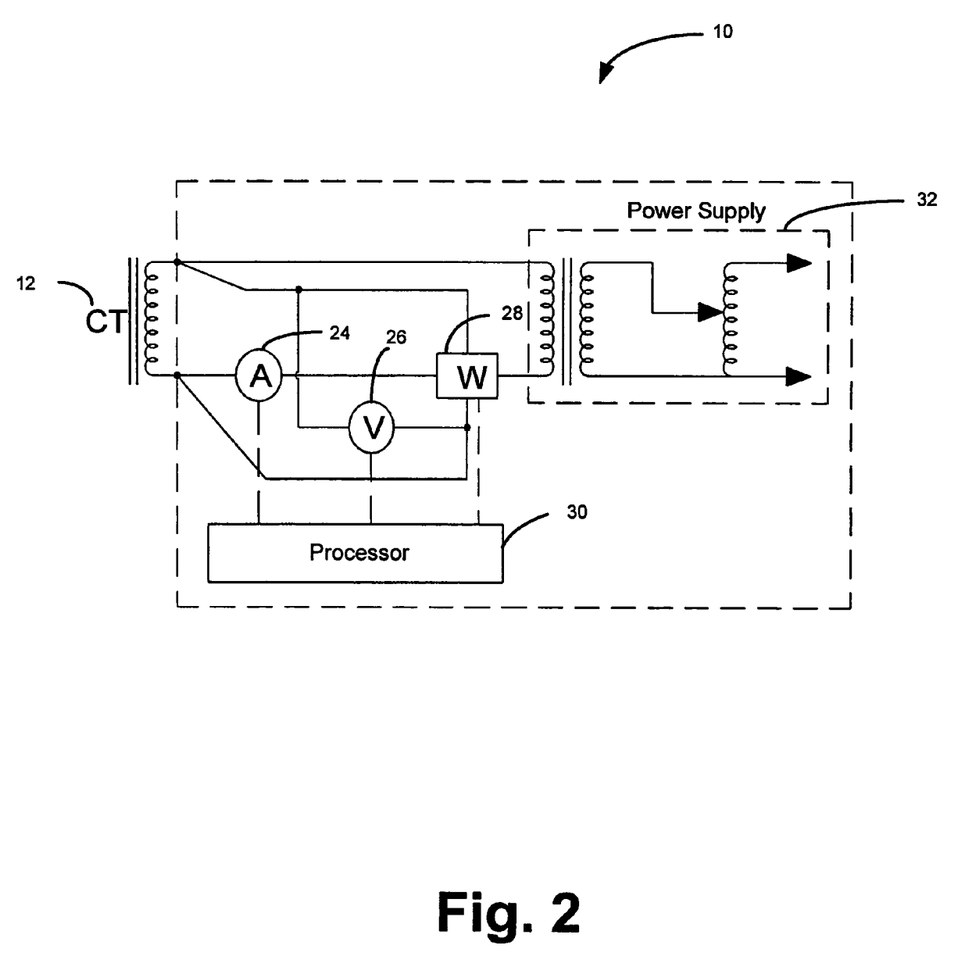
FIG. 2 is a schematic of a test system of a current transformer in accordance with one embodiment of the invention.

In addition to the CT 12 and to the electrical apparatus 15, a test system 10 is illustrated in FIG. 1A. The test system 10 is a computer that executes a computer program, stored in memory, for evaluating the accuracy of the CT 12. FIG. 2 illustrates one embodiment of the test system 10 coupled to CT 12. The test system 10 includes a power supply 32 that generates the precise voltage ($V_T$) that is applied to the secondary winding 16 of the CT 12. The test system 10 also includes an ampere meter (amp meter) 24 for measuring the current, a volt meter 26 for measuring the voltage, and a watt meter 28 for measuring the real power (also referred to as active power).

The processor 30 is that portion of a computer that includes circuits controlling the interpretation and execution of instructions. The processor 30 encompasses all types of processors and includes microprocessors. The processor 30 is coupled to amp meter 24, volt meter 26 and watt meter 28 through buses such as serial buses. Once digital values such as the value of the current from the amp meter 24, the voltage from volt meter 26, and the watts from the watt meter 28 have been detected, this data is transferred over their respective buses to processor 30. Given this description of test system 10, a method to evaluate a CT 12 is now described.

Figure 3A:
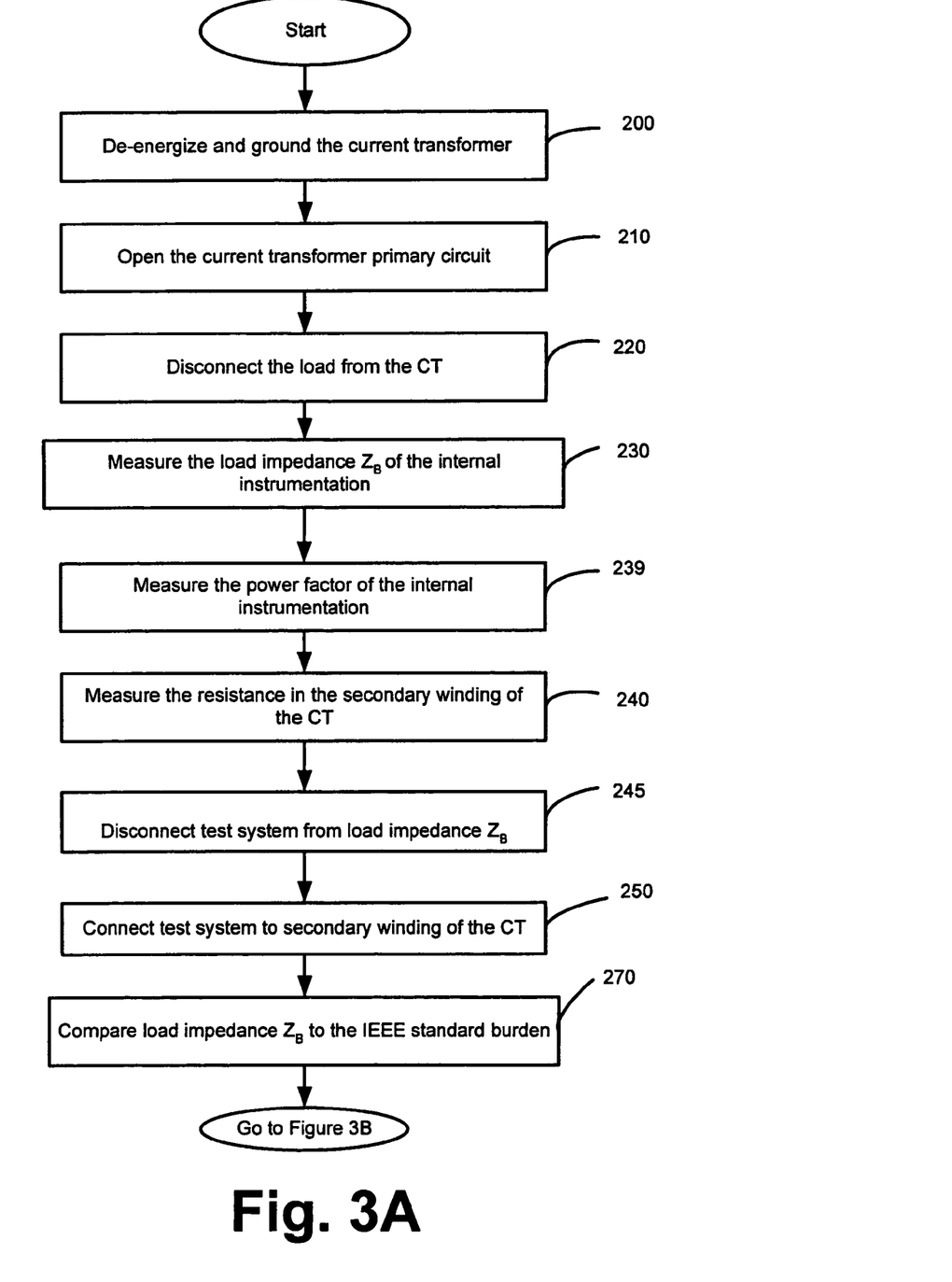
FIGS. 3A–3B are flow diagrams of one method of evaluating the accuracy of a current transformer in accordance with one embodiment of the invention.
Figure 3B:
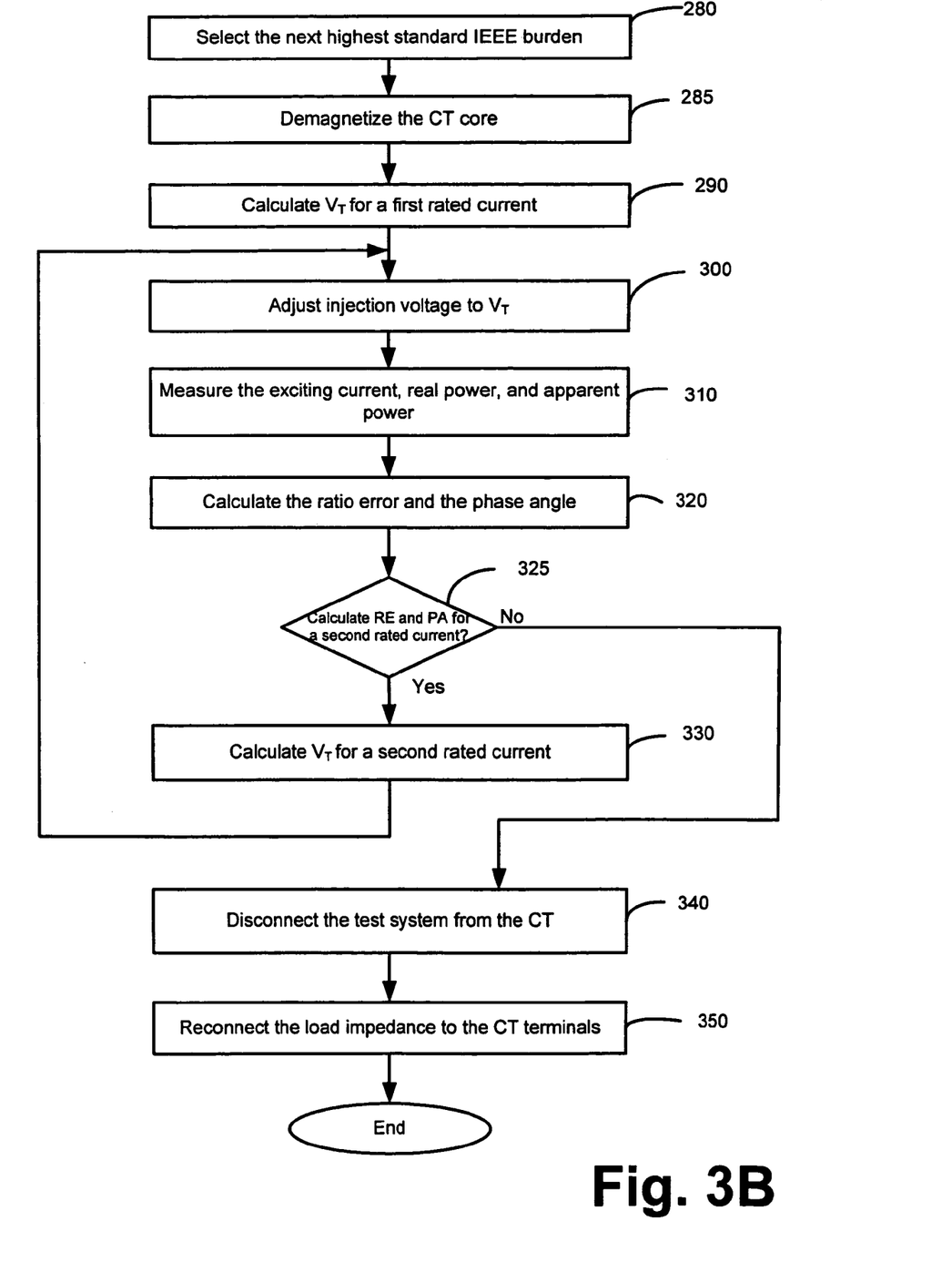

FIGS. 3A–3B are flow diagrams of an exemplary method for verifying the accuracy of a CT 12. FIGS. 1A–1L, referred to in FIGS. 3A–3B, show various configurations of the test system 10 relative to the CT 12 being tested. As previously discussed, the CT 12 is initially coupled to both the electrical apparatus 15 and the internal instrumentation 14. This configuration is shown in FIG. 1A. The CT 12 is de-energized at operation 200 while it remains in its position in or on the electrical apparatus 15.

The primary circuit of the CT 12 is opened at operation 210 to prevent a current from circulating therethrough. This may be accomplished, for example, by disconnecting the CT 12 from a primary conductor 26 of the electrical apparatus 15 such as removing the connection to the bushing of a power transformer. Alternatively, a primary switch can be opened which also prevents a primary current from circulating through the primary winding 18 of the CT 12. Disconnecting the primary conductor 26 from CT 12 is shown in FIG. 1B.

Figure 1C:
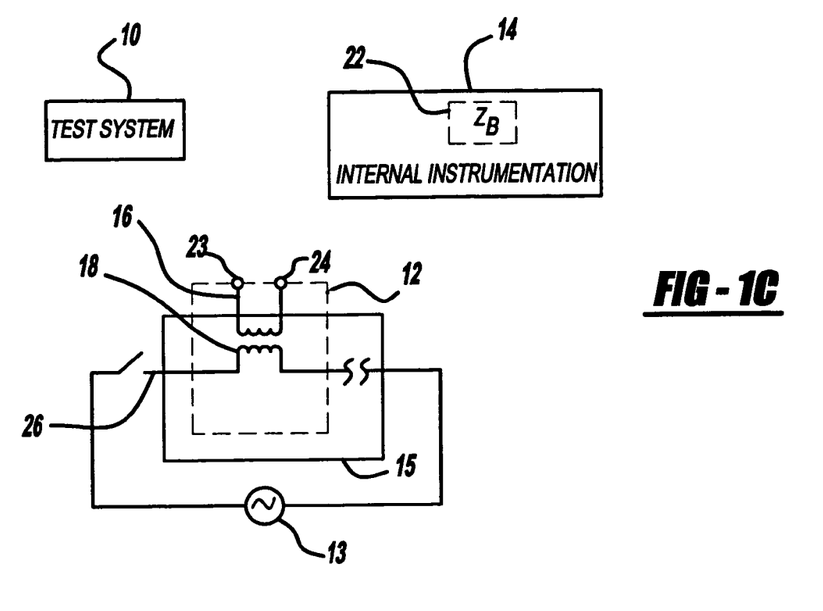
FIG. 1C illustrates a block diagram of internal instrumentation being disconnected from a current transformer in accordance with one embodiment of the invention.
Figure 1D:
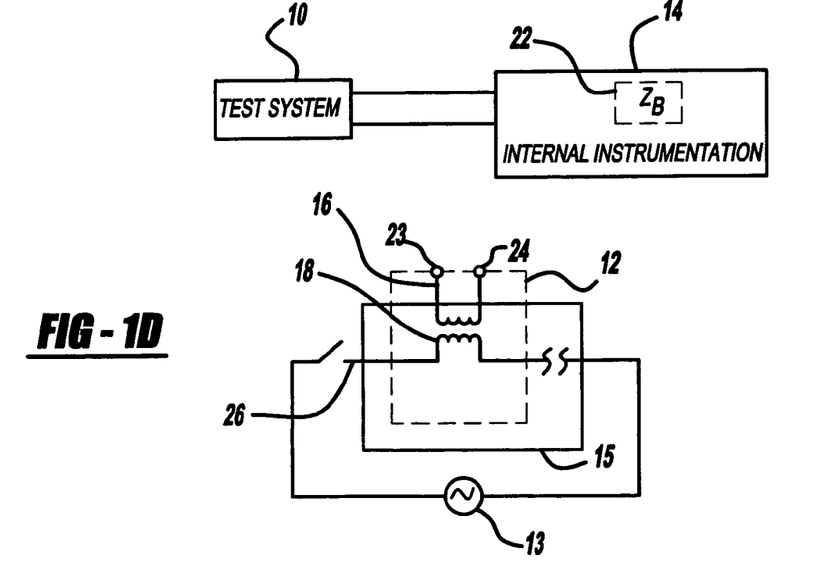
FIG. 1D illustrates a block diagram of a test system coupled to internal instrumentation of the current transformer in accordance with one embodiment of the invention.

The load impedance $Z_B$ 22 is then disconnected from the terminals 23, 24 of the CT 12 at operation 220. Disconnecting $Z_B$ 22 from the terminals 23, 24 of the CT 12 is shown in FIG. 1C.

Figure 4:
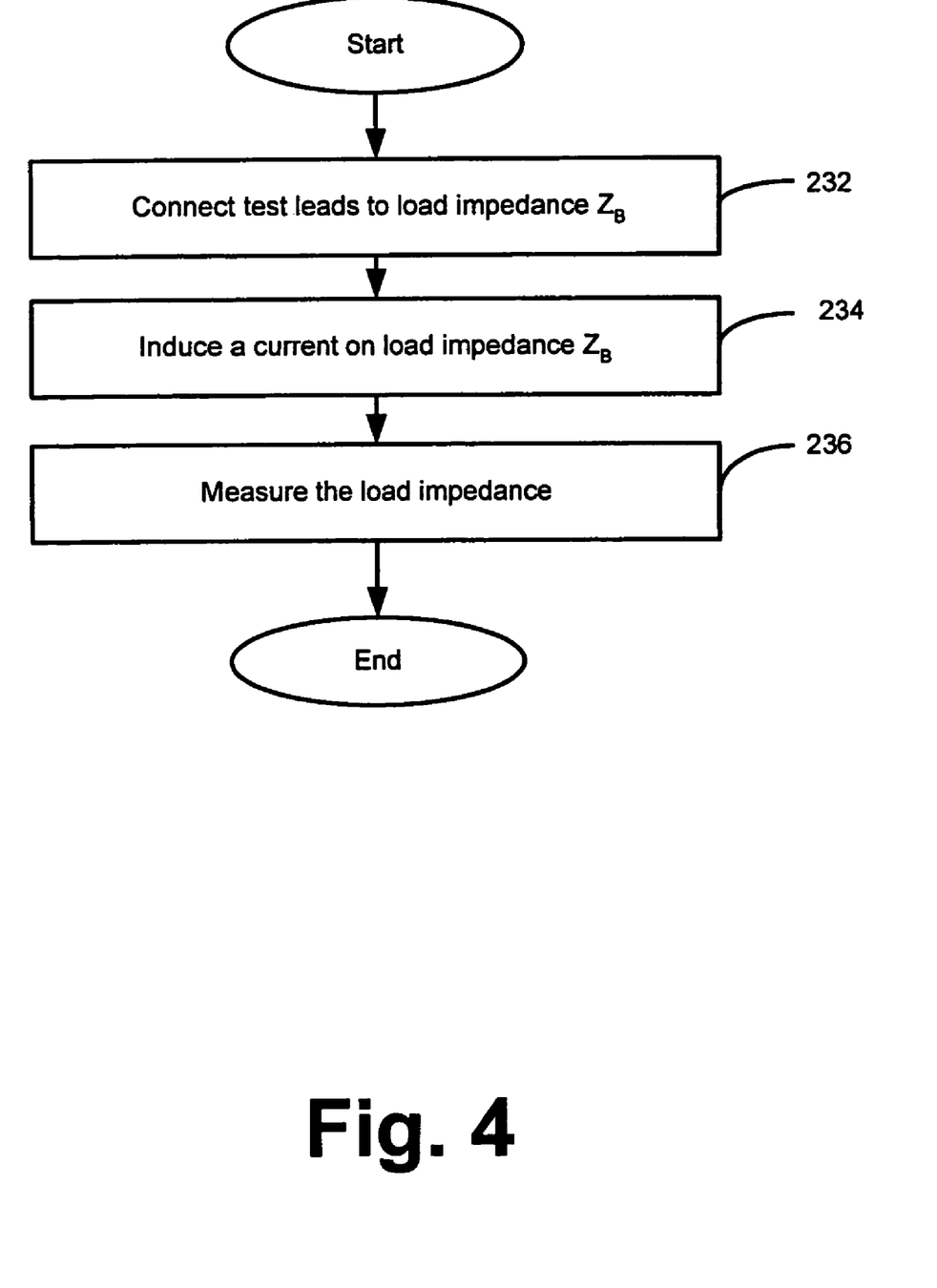
FIG. 4 is a flow diagram for measuring a load impedance $Z_B$ in accordance with one embodiment of the invention.

At operation 230, the load impedance, $Z_B$ 22, is determined by, for example, measuring the load impedance $Z_B$ 22 of the internal instrumentation 14. Measuring the load impedance $Z_B$ 22 typically involves implementing operations 232–236 shown in the flow diagram of FIG. 4. The test leads are connected to the load impedance $Z_B$ 22 at operation 232. The load impedance $Z_B$ 22 is shown by ghost lines in FIG. 1D. A current such as a one ampere current is induced on the load impedance $Z_B$ 22 at operation 234. The voltage across the load impedance $Z_B$ 22 is measured at operation 236. Skilled artisans appreciate that there are numerous other methods that may be used to determine load impedance $Z_B$ 22.

Figure 5:
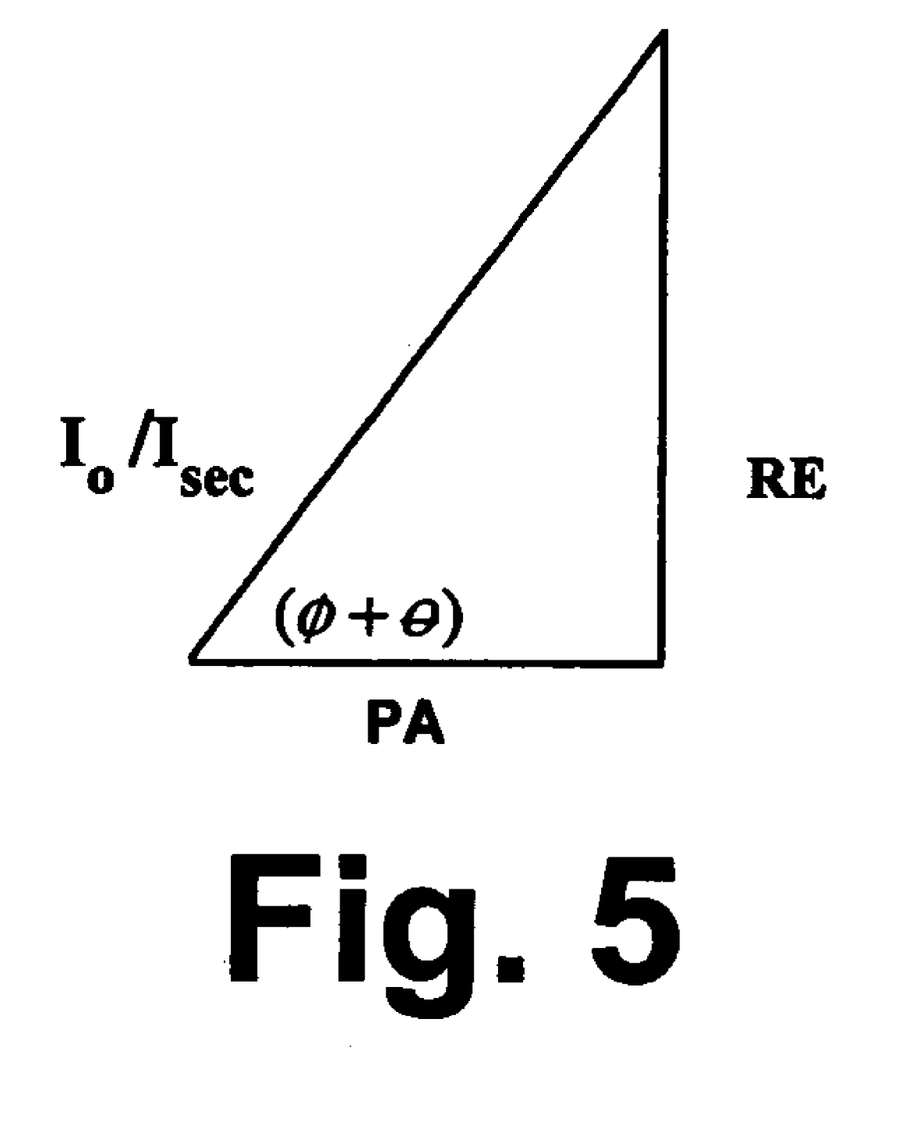
FIG. 5 is a triangle that illustrates the relationship between a ratio error and a phase angle.

The power factor of the internal instrumentation 14 is also determined, through, for example, actual measurements using conventional techniques at operation 239. The power factor is used to calculate theta θ. Theta θ, shown in FIG. 5, is then used in equations 5 and 6 below to calculate RE and PA.

Figure 1E:
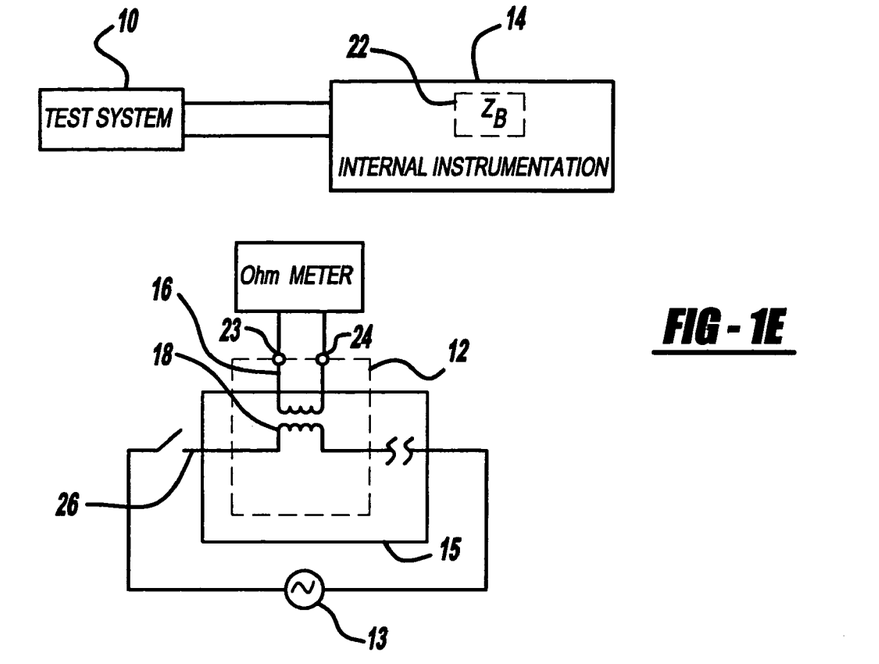
FIG. 1E illustrates a block diagram of a test system coupled to internal instrumentation of a current transformer and an ohm meter coupled to the current transformer in accordance with one embodiment of the invention.

An ohm meter 33 such as a digital ohm meter is connected to the secondary winding 16 for measuring the direct current (DC) resistance $R_W$ in the CT 12 secondary winding 16 at operation 240. The connection of the ohm meter 33 to the secondary winding 16 is shown in FIG. 1E. In order to measure the resistance, the ohm meter 33 supplies a low current to the secondary winding 16 of the CT 12.

Figure 1F:
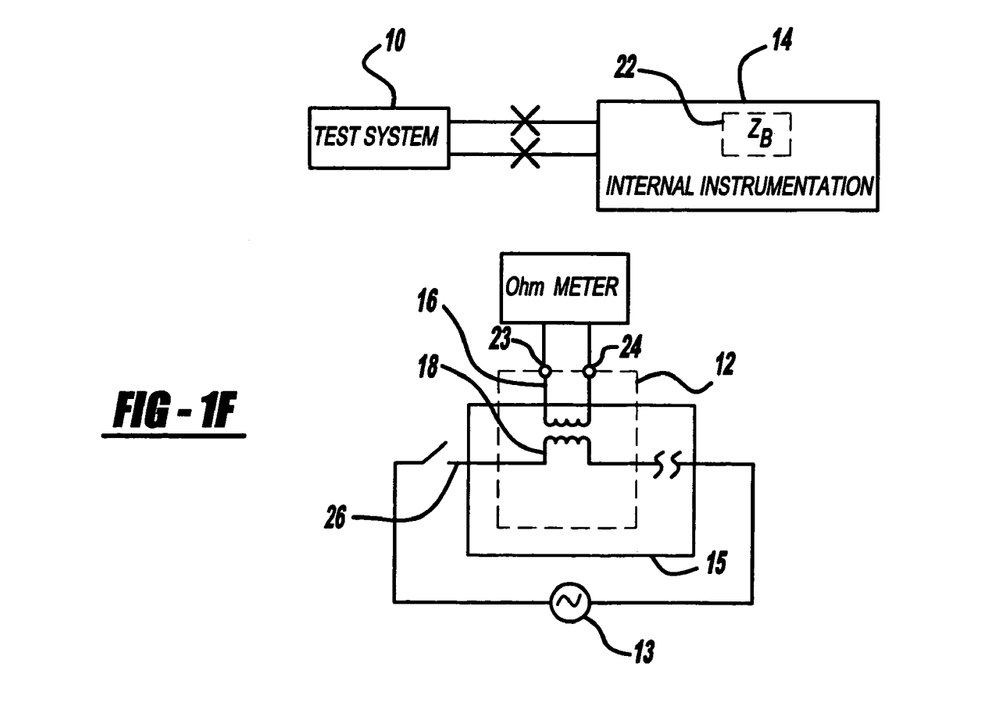
FIG. 1F illustrates a block diagram of a test system disconnected from the internal instrumentation of the current transformer in accordance with one embodiment of the invention.
Figure 1G:
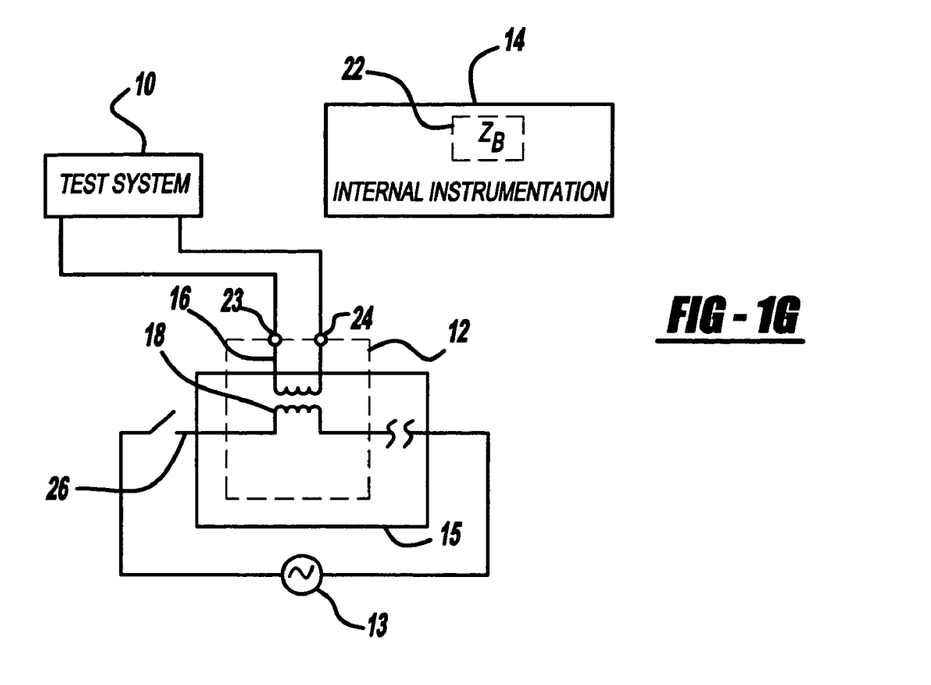
FIG. 1G illustrates a block diagram of a test system coupled to a current transformer in accordance with one embodiment of the invention.
Figure 1H:
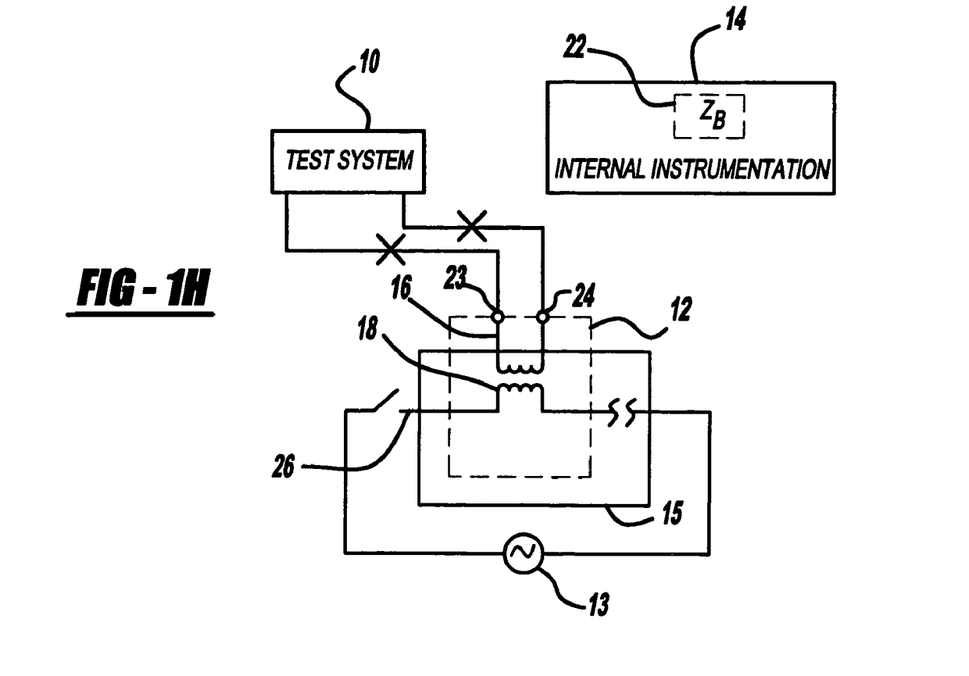
FIG. 1H illustrates a block diagram of a test system disconnected from the current transformer in accordance with one embodiment of the invention.

The test set leads are disconnected from the load impedance $Z_B$ 22 at operation 245. This disconnection between the test set leads and the load impedance $Z_B$ 22 is shown in FIG. 1F. The test set leads from test system 10 are then connected to the secondary winding 16 of the CT 12 at operation 250. This configuration of the test set leads connected to the secondary winding 16 is shown in FIG. 1G.

At operation 270, the load impedance $Z_B$ 22 that is determined in operation 230 is compared to the burden that is listed in IEEE C57.13 (1993). For example, if the load impedance $Z_B$ 22 is measured at 0.4 ohms (Ω) but IEEE C57.13 (1993) provides the standard burdens of 0.1 Ω, 0.5 Ω, 0.9 Ω and 1.8 Ω. The next highest standard IEEE burden from the load impedance of 0.4 Ωis selected at operation 280. In this example, a standard IEEE burden of 0.5 Ω(i.e., B0.5 from the IEEE standard) is selected. The standard IEEE burden value is used as the value for the load impedance $Z_B$. This value is then inputted into a computer program executed by the processor 30 of the test system 10. The standard burden value $Z_B$ is either manually inputted by a user of test system 10 or it is automatically determined by test system 10. Skilled artisans appreciate that other suitable methods may be used to determine a burden to be used with test system 10. Skilled artisans also appreciate that the value for the load impedance $Z_B$ is used, as described below, to calculate a resistive component $R_B$ of the secondary winding 16.

The CT core is then demagnetized using conventional techniques at operation 285. The value of the secondary voltage ($V_T$) is calculated at operation 290 by the test system 10 for a first rated current such as a 100% rated current.

To calculate $V_T$, several variables are first determined by the processor 30 of the test system 10. As a preliminary matter, equation one is a fundamental formula for CT magnetic theory that relates the primary and secondary currents $I_{pri}$, $I_{sec}$, respectively, in the following manner:

$$\frac{I_{pri}}{N} = I_{sec} + I_o \quad (1)$$

Figure 6:
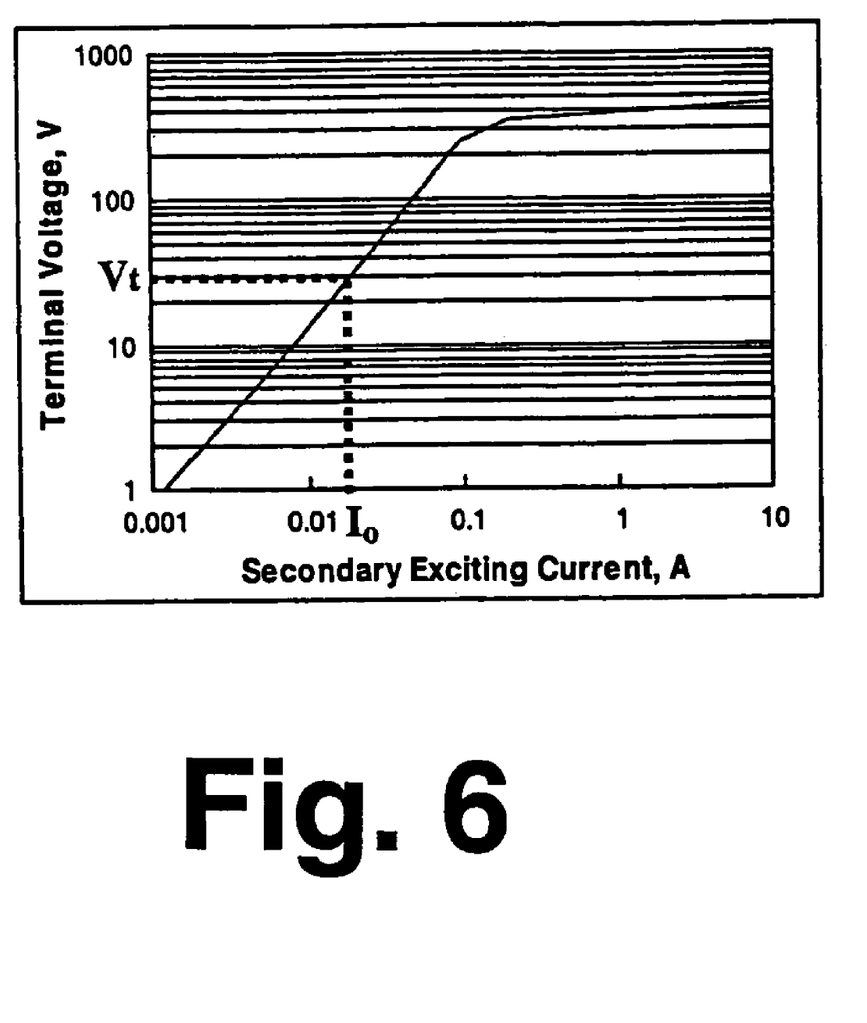
FIG. 6 illustrates a secondary excitation curve that shows the operating characteristics involved in the derivation of the ratio and phase angle errors for a current transformer in accordance with one embodiment of the invention.

$I_o$ is a secondary exciting current and N is a number of turns in the secondary winding 16 of the CT 12. At a defined operating condition, the secondary exciting current, $I_o$, represents an absolute composite error for the induced secondary voltage, $V_T$. FIG. 6 graphically illustrates a secondary excitation curve for deriving the PA and the RE of the CT 12 in which $V_T$ is a voltage at the terminals of the CT 12.

$I_{sec}$, the current through the secondary winding 16 is known. In order to determine $V_T$, $Z_E$ must be determined. The relationship between $V_T$, $I_{sec}$, and $Z_E$ is presented in equation 2 as follows:

$$V_T = I_{sec} * Z_E. \quad (2)$$

Total Impedance, $Z_E$, is as follows:

$$Z_E = \sqrt{(R_E^2 + X_B^2)} \quad (3)$$

where $R_E$ is the real or resistive component and $X_B$ is the reactive component. Generally, $R_E$ is referred to as the total resistance in the circuit. $R_E$ includes a resistive component of the burden ($R_B$) of impedance $Z_B$ 22 and the resistance ($R_W$) in the secondary winding 16 of the CT 12. The relationship between these variables is shown by equation 4, which is as follows:

$$R_E = R_B + R_W \quad (4)$$

To determine the magnitude of the real or resistive components of impedance $Z_E$, $R_W$ and $R_B$ are determined. $R_B$ is generally calculated by multiplying the burden by the power factor of the burden. The IEEE C57.13 (1993) standard determines $R_B$ through $R_B = Z_B * 0.9$, whereas the International Electrotechnical Commission standard determines $R_B$ with $R_B = Z_B * 0.8$. Since $R_W$ was previously measured at operation 240, $R_E$ may now be calculated by using equation 4.

Figure 7:
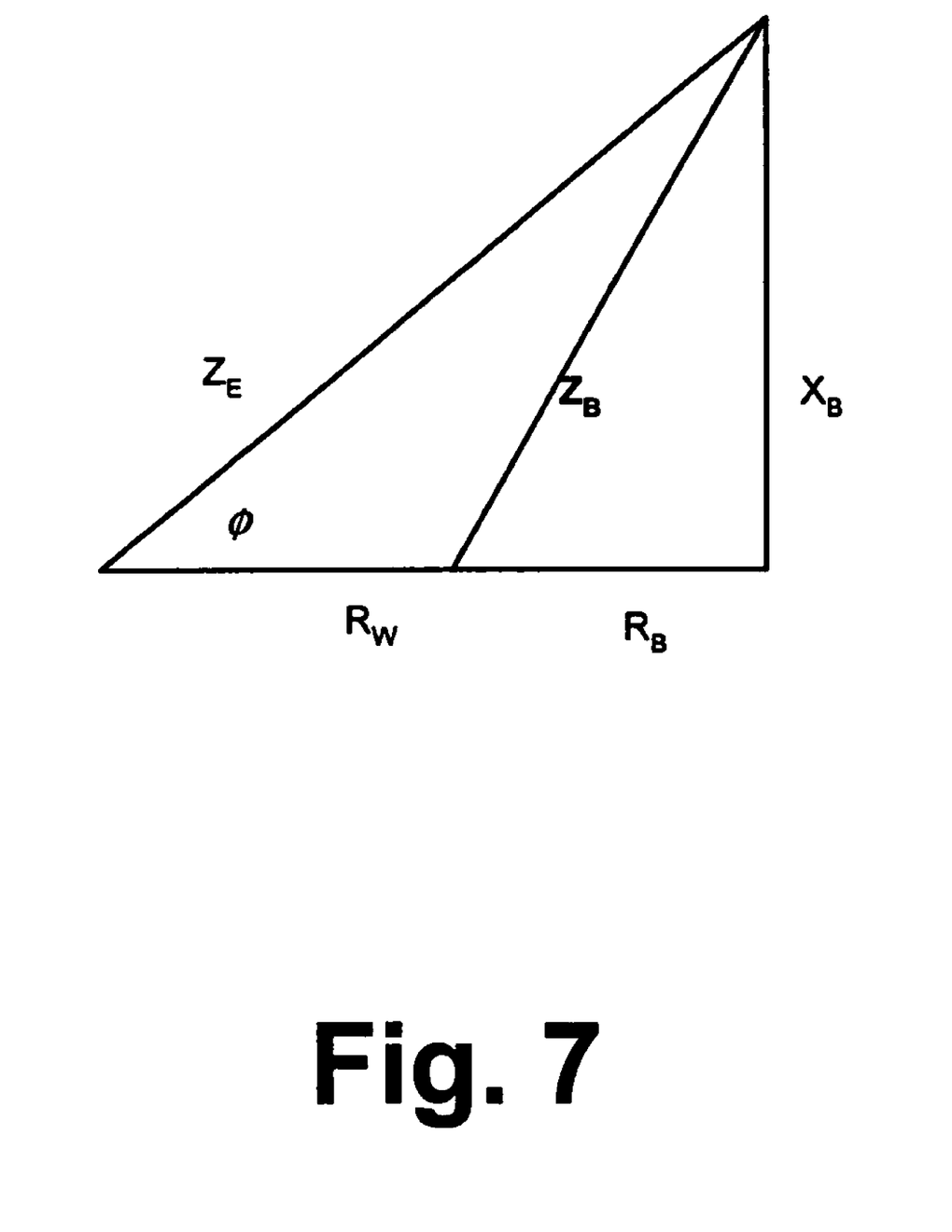
FIG. 7 is a triangle that illustrates the relationship between the total load impedance, a standard IEEE burden impedance, and the winding resistance of a current transformer in accordance with one embodiment of the invention.

After $R_E$ has been determined, Phi $\phi$ may be determined. Phi, $\phi$, is the angle between the total impedance $Z_E$ and the summation of $R_B$ and $R_W$ which forms the total resistance $R_E$. The relationship between the total impedance $Z_E$ is shown relative to the $R_B$, $R_W$ in FIG. 7. The load impedance $Z_B$ and the real component $X_B$ are also shown.

The injection voltage is adjusted to a value of $V_T$ at operation 300. The secondary exciting current $I_o$, the apparent power (VA), and the real or active power are determined through physical measurements at operation 310. For example, $I_o$ is read from the amp meter 24 and the real power is determined from the watt meter 28 of test system 10. The apparent power, VA, is the product of the measured voltage and the current. Theta $\theta$ is the angle between real and apparent power.

The RE and PA displacement are calculated at operation 320 using equations 5 and 6. RE is defined in equation 4 as follows:

$$RE = (I_o/I_{sec}) * \sin(\phi + \theta) \quad (5)$$

The PA is defined in equation 6 as follows:

$$PA = (I_o/I_{sec}) * \cos(\phi + \theta) \quad (6)$$

The relationship between the RE and the PA is shown by the right triangle in FIG. 5, where $I_o/I_{sec}$ is the hypotenuse, RE is the vertical side, PA is the horizontal side, and the angle is formed by the summation of $\phi$ and $\theta$.

A decision is made by a user of the test system 10 at operation 325 as to whether to calculate RE and PA for a second rated current such as a 10% rated current. If so, operation 330 is implemented which indicates that the value of $V_T$ is calculated for a second rated current such as 10% of the rated current. Operations 300 through 320 are then repeated for a second rated current. In contrast, if the user does not need to calculate RE and PA for another rated current, the test set leads of test system 10 are disconnected from the CT 12 (shown in FIG. 1H) at operation 340. As shown in FIG. 1L, the load impedance $Z_B$ 22 is reconnected to the CT 12 terminals 23, 24 at operation 350.

Figure 8:
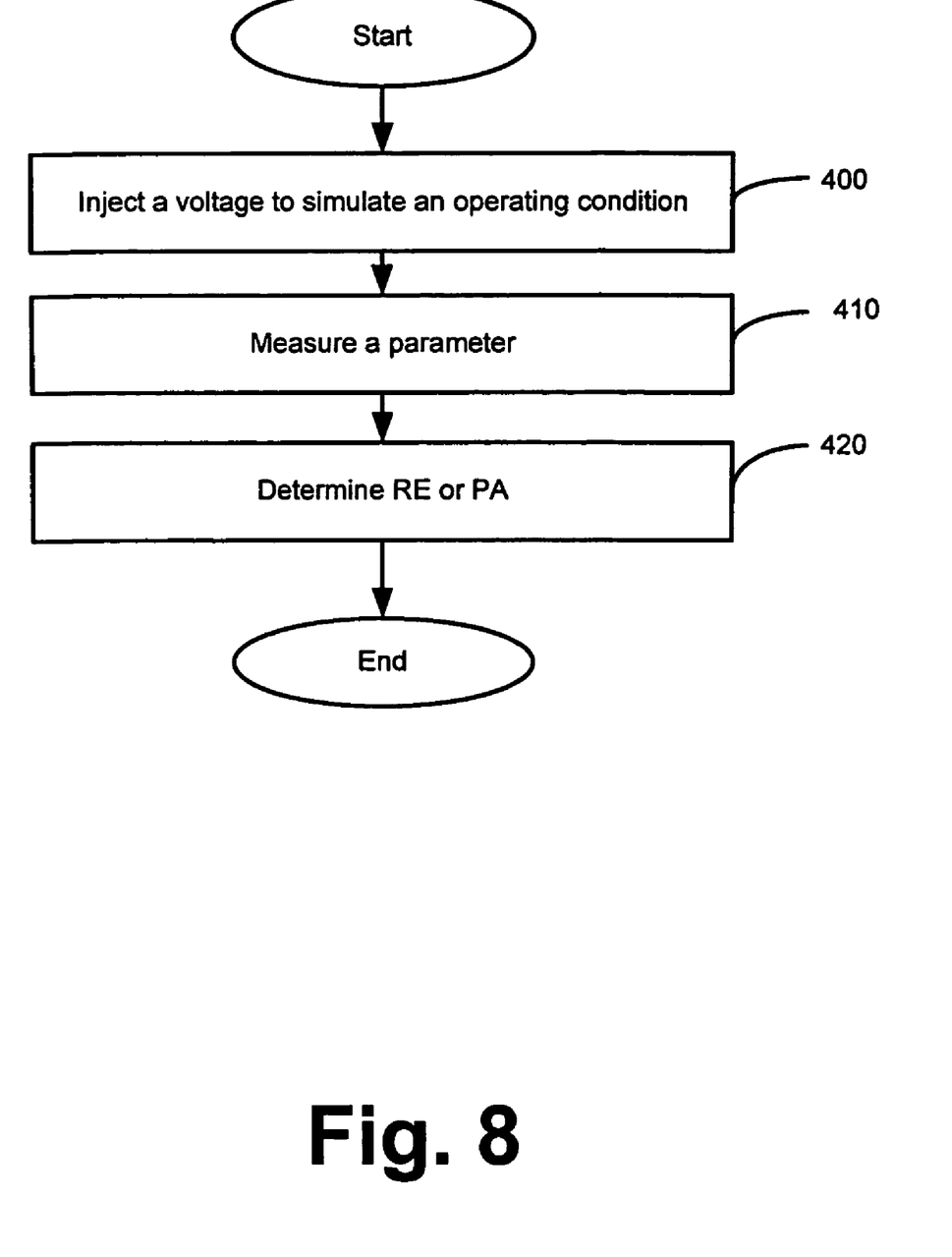
FIG. 8 is one method of evaluating the accuracy of a current transformer in accordance with one embodiment of the invention.

FIG. 8 illustrates one method of evaluating the accuracy of a current transformer in accordance with one embodiment of the invention. In this embodiment, a primary current is not circulated through the primary winding 18 of the CT 12. Voltage is injected into the CT 12 to simulate an operating condition at operation 400. In one embodiment, the operating condition is the secondary excitation current.

A parameter associated with the CT 12 is measured at operation 410. This parameter may be load impedance $Z_B$ 22, the resistance of the secondary winding 16, or the real or apparent power.

Either a RE or a PA associated with a current transformer is determined based directly or indirectly. On the parameter at operation 420. The CT 12 is evaluated without removing the CT 12 from a position in an electrical apparatus 15. Specifically, the primary conductor 26 is merely open on the electrical apparatus 15 to ensure the CT primary loop 18 is not continuous. The CT 12 is not physically moved away from the electrical apparatus 15.

It will be appreciated that more or fewer processes may be incorporated into the methods described above without departing from the scope of the invention and that no particular order is implied by the arrangement of blocks shown and described herein. Skilled artisans will appreciate that the methods described above may be embodied in machine-executable instructions (e.g., software). The instructions can be used to cause a general-purpose or special-purpose processor that is programmed with the instructions to perform the operations described. Alternatively, the operations may be performed by specific hardware components that contain hard-wired logic for performing the operations, or by any combination of programmed computer components and custom hardware components.

The methods may be provided as a computer program product that may include a machine-readable medium having stored thereon instructions which may be used to program a computer (or other electrical apparatus) to perform the methods. For the purposes of this specification, the terms "machine-readable medium" includes any medium that is capable of storing or encoding a sequence of instructions for execution by the machine and that cause the machine to perform any one of the methodologies of the present invention. The term "machine-readable medium" includes, but is not be limited to, solid-state memories, optical and magnetic disks, and carrier wave signals. Furthermore, it is common in the art to speak of software, in one form or another (e.g., program, procedure, process, application, module, logic, etc.), as taking an action or causing a result. Such expressions are merely a shorthand way of saying that the execution of the software by a computer causes the processor of the computer to perform an action or a produce a result.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method for testing of a current transformer having a primary winding and a secondary winding without a current circulating through the primary winding comprising:
    determining an operating burden for the current transformer;
    determining a resistance value of the secondary winding of the current transformer;
    determining an input voltage for the current transformer based on the operating burden and the resistance value of the secondary winding;
    injecting the input voltage to a secondary winding of the current transformer;
    determining an excitation current flowing through the secondary winding of the current transformer while the input voltage is being injected into the secondary winding of the current transformer;
    determining an excitation wattage across the secondary winding of the current transformer while the input voltage is being injected into the secondary winding of the current transformer; and
    determining at least one of a ratio error and a phase angle associated with the current transformer based on the excitation current and the excitation wattage;
    wherein the current transformer remains in a position adjacent to an electrical apparatus.

2. The method of claim 1, further comprising:
    applying a first voltage to the secondary winding relative to an operating condition of the current transformer.

3. The method of claim 1 further comprising:
    applying a second voltage to the secondary winding relative to another operating condition of the current transformer.

4. A method for evaluating a current transformer having a primary winding and a secondary winding while the current transformer remains in position in or on the electrical apparatus comprising:
    de-energizing the current transformer;
    disallowing a primary current from circulating in the primary winding;
    determining a load impedance in an internal instrumentation of a current transformer;
    determining a resistance in the secondary winding;
    comparing the load impedance to a standardized burden;
    selecting a standardized burden;
    demagnetizing a current transformer core;
    determining a first input voltage to the current transformer for a first rated current;
    injecting a voltage into the current transformer;
    measuring one of an excitation current, a real power, and an apparent power associated with the current transformer; and
    determining at least one of a ratio error and a phase angle associated with the current transformer based upon the injected voltage.

5. The method of claim 4, wherein the first rated current is 100% of the rated current.

6. The method of claim 4 further comprising:
    determining a second input voltage for the current transformer.

7. The method of claim 6 further comprising:
    applying a second rated current to the secondary winding of the current transformer.

8. The method of claim 7, wherein the second rated current is 10% of the rated current.

* * * * *